United States Patent [19]

Ströbel et al.

[11] Patent Number: 4,697,148
[45] Date of Patent: Sep. 29, 1987

[54] PROCESS FOR THE EXCITATION OF A SAMPLE FOR NMR TOMOGRAPHY

[75] Inventors: Bernhard Ströbel, Waldbronn; Dieter Ratzel, Rheinstetten, both of Fed. Rep. of Germany

[73] Assignee: Bruker Medizintechnik GmbH, Rheinstetten-Forchheim, Fed. Rep. of Germany

[21] Appl. No.: 723,808

[22] Filed: Apr. 16, 1985

[30] Foreign Application Priority Data

Apr. 18, 1984 [DE] Fed. Rep. of Germany ....... 3414634

[51] Int. Cl.$^4$ ............................................. G01R 33/20
[52] U.S. Cl. ..................................................... 324/309
[58] Field of Search ......................... 324/307, 309, 322

[56] References Cited

U.S. PATENT DOCUMENTS 4,451,788 5/1984 Edelstein et al. ................... 324/309

FOREIGN PATENT DOCUMENTS 0098426 6/1983 European Pat. Off. .
0132975 7/1984 European Pat. Off. .
2928551 7/1979 Fed. Rep. of Germany .
3135335 9/1981 Fed. Rep. of Germany .

Primary Examiner—Michael J. Tokar
Assistant Examiner—Francis J. Jaworski
Attorney, Agent, or Firm—Kokjer, Kircher, Bradley, Wharton, Bowman & Johnson

[57] ABSTRACT

The use of longer 180° pulse sequences for the generation of spin echos is made possible according to the invention during NMR tomography using the 2d-Fourier transformation process in that the phase coding gradient between each pair of 180° pulses is switched on in such a manner that the dephasing caused between each pair of 180° pulses by the phase coding gradient is twice as great as the dephasing caused before the beginning of the first 180° pulse by the phase coding gradient. The mirror images which appear otherwise when using the known 180° pulse sequences, e.g. the Carr-Purcell-Gill-Meiboom pulse sequence, are avoided by this measure.

7 Claims, 11 Drawing Figures

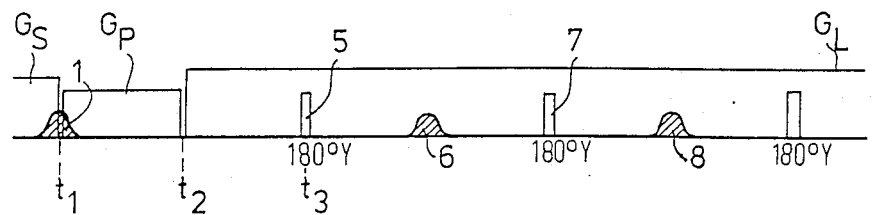
Prior Art  Fig. 1
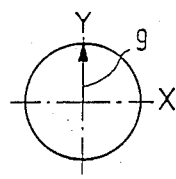
Fig. 2a
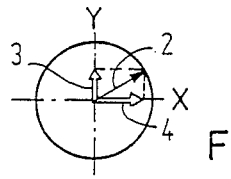
Fig. 2b
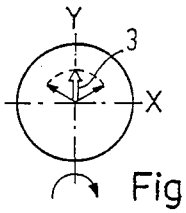    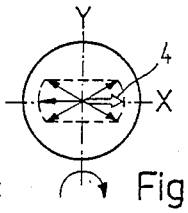
Fig. 2c   Fig. 2d
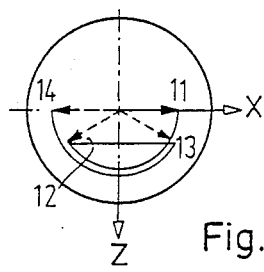    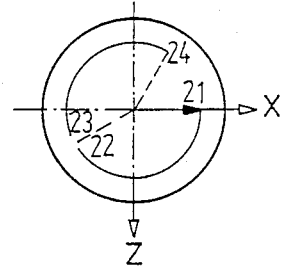
Fig. 3a   Fig. 3b

PROCESS FOR THE EXCITATION OF A SAMPLE FOR NMR TOMOGRAPHY

BACKGROUND AND SUMMARY OF THE INVENTION

The present invention relates to a process for the excitation of a sample for NMR tomography, wherein the sample is exposed to a homogenous magnetic field and in addition to a selection gradient, and is excited by a 90° selection pulse, whereafter the selection gradient is replaced by a time-restricted phase coding gradient and a read gradient, the selection gradient, phase coding gradient, and read gradient being perpendicular to each other respectively in pairs, and wherein lastly the sample, after the end of the phase coding gradient, is irradiated during the prevailing read gradient with a sequence of 180° pulses, whereby measurable core induction signals in the form of the so-called spin echos are generated.

The generation and measurement of core resonance signals after the influencing of the sample by a time-restricted phase coding gradient which is supplied before switching on the read gradient leads by the use of a two-dimensional Fourier transformation to the generation of cross-sectional images, for which reason this process is also named 2DFT. As was stated above, it is conceivable in principle to use for the generation of core induction signals the spin echo pulse sequences which are generally employed in NMR spectrometry, such as particularly the Carr-Purcell pulse sequence or the Carr-Purcell-Gill-Meiboom pulse sequence. These pulse sequences, after common excitation, make possible the generation of a plurality of echo signals which can be added up to improve the signal-noise ratio or can be used to determine the spin-spin relaxation time $T_2$. But it has been found that when employing the 2DFT method the previously known pulse sequences are only usable to a limited extent, since with the growing number of echos, artefacts in the form of images appear to an increasing extent, which are reflected with respect to the undisturbed image on an axis which is parallel to the direction of the read gradient. Such artefacts will hereinafter be named mirror images.

Since on the other hand for example the exact determination of $T_2$ or an analysis according to various $T_2$ contributions during a multi-exponential spin-spin relaxation is only practicable with the aid of many spin echos, the 2DFT process could not previously be used for such investigations which are of great significance in diagnostic medicine, although it has the advantage that good images are supplied even with relatively low homogeneity of the magnetic field, so that this process would be especially well suited, inter alia, for simple installations from this point of view.

Accordingly it is the object of the invention to improve the process of the type described initially so that when using spin echo pulse sequences, no mirror images will arise.

This object is achieved according to the invention in that the sample, in the course of a spin echo pulse sequence, is subjected to the influence of the phase coding gradient in such a manner that the dephasing effected between each two 180° pulses by the phase coding gradient is twice as great as the dephasing which is effected before the first 180° pulse by the phase coding gradient.

It is known in NMR tomography as well as in NMR spectroscopy that when using a spin echo pulse sequence, the rephasing condition for the read gradient must be fulfilled. This is most simply achieved in that with constantly occurring read gradients the time interval of two adjacent 180° pulses is chosen so as to be twice as great as the interval between the beginning of the dephasing by the read gradient and the first 180° pulse.

The process according to the invention has the result that the rephasing conditions are fulfilled not only for the read gradient but also for the phase coding gradient. However the measuring process is only carried out in the presence of the read gradient, whereas the phase coding gradient is switched so that by means of this gradient constant dephasing during the period of each measuring process is effected which is identical for all the measuring processes within one spin echo pulse sequence. This is attained by repeated switching on of the phase coding gradient between each pair of 180° pulses in any of the ways which will be described below.

According to a first embodiment of the invention, the phase coding gradient is switched on before the beginning of the first 180° pulse for the first time, whereby a certain dephasing is caused, and then switched on again between each two 180° pulses, but after the ending of the measuring process for each spin echo, so that the dephasing caused thereby is twice as large as the dephasing caused during the first action of the phase coding gradient before the first 180° pulse.

According to a second embodiment of this invention, the phase coding gradient is switched on for the first time before the beginning of the first 180° pulse, whereby a certain dephasing is effected, and subsequently again between each pair of 180° pulses, but before the beginning of the measuring process for each spin echo, so that the dephasing caused thereby is twice as large as the dephasing caused during the first action of the phase coding gradient before the first 180° pulse.

According to a third embodiment of the invention, the phase coding gradient is not switched on at all before the first 180° pulse, but is switched on for the first time after the first 180° pulse, in such a way that it is at first switched on between each two 180° pulses before the beginning of the measuring process, so that a certain dephasing is caused, and subsequently after the end of the measuring process, but before the beginning of the next 180° pulse it is switched on again with reversed sign so that this second action of the gradient again cancels the dephasing effected by the first action.

The process according to the invention makes possible in particular the use of a conventional Carr-Purcell-Gill-Meiboom pulse sequence for NMR tomography using the 2DFT process. By adhering to the rephasing condition for the phase coding gradient as well, the effects which lead to the formation of mirror images are cancelled out. Thus the phase coding gradient can be switched on without any difficulties additionally to the read gradient, because when using the 2DFT process the effect of the two gradients is independent of each other.

BRIEF DESCRIPTION OF THE DRAWINGS

The invention will be explained and described below in more detail with reference to the diagrams shown in the drawing in which:

FIG. 1 shows a time diagram of the gradient fields and signals using a conventional 2DFT process when employing a Carr-Purcell-Gill-Meiboom pulse sequence, FIG. 2a shows a phasor diagram illustrating the spin moments rotated in the x-y plane using the process shown in FIG. 1 and with the spin moment at time $t_1$;

FIG. 2b is a view similar to FIG. 2a showing the spin moment broken down into x and y components;

FIG. 2c and FIG. 2d are similar to FIG. 2a showing the de-phasing of the x and y components at time $t_3$.

FIG. 3 shows phasor diagrams of the spin moments shown in FIG. 2 in the X-Z plane.

DESCRIPTION OF THE PREFERRED EMBODIMENTS

Figure 4A:
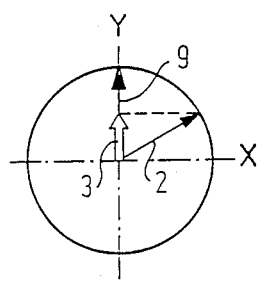
FIG. 4 shows phasor diagrams to explain the occurrence of mirror images.

As is well known, in NMR tomography a sample to be examined, especially a human body or part of the body, is exposed to a strong homogenous magnetic field $B_0$, whose direction is usually associated with the Z-axis of a rectangular system of coordinates. Due to the influence of the magnetic field, the magnetic spin moments of the atomic core in the sample are normally, i.e. without any additional external influence, aligned in the Z-direction. The information required to produce an image can however only be obtained from the HF signals, which are generated by the components perpendicular to Z of the spin moment which is rotating in the X,Y plane around the Z-direction. These signals are named core induction signals. Therefore, the spin moments in the areas to be imaged of the sample must be rotated out of the Z-direction, preferably by 90° into the X,Y plane, by irradiation of high frequency in a suitable manner.

For imaging a cross-section of the sample to be investigated, the spin moments must therefore be rotated within a selected section of the sample as completely as possible into the X,Y plane, whereas the spin moments outside the section must remain aligned as completely as possible in the Z-direction. This process is called selective excitation of the spin moments; the time interval within a tomographic process during which the selective excitation takes place is called the selection phase.

The spin moments rotated into the X,Y plane are exposed in the 2DFT process to the dephasing effect of the gradient fields designated as phase coding gradient and read gradient. Since the information required to form an image is obtained from the influence of this dephasing on the core induction signals to be observed, the selective excitation must be performed so that thereby the spin moments to be excited are as far as possible rotated in phase in the X,Y plane, i.e. so that they rotate without the influence of the phase coding gradient or of the read gradient as far as possible in the same phase around the Z-direction.

A known process for selective excitation which meets this condition consists in that the homogenous magnetic field $B_0$ has superimposed thereon a magnetic gradient field which is also aligned parallel to the Z-direction, whose strength alters however along a direction which is perpendicular to the cross-sectional plane chosen for the image. This gradient field is named the selection gradient. Under the influence of the adjacent magnetic fields, the Larmor frequency of the spin moments in the sample changes along the direction of the selection gradient. (The direction in which the magnetic field strength alters in the presence of a gradient field will hereinafter be described briefly as the direction of this gradient.) By irradiating of a narrow-band HF pulse, therefore, the spin moments within a section of the sample perpendicular to the direction of the selection gradient, whose thickness is defined by the band width of the HF pulse, can be rotated about an angle $\alpha$ out of the direction of the Z axis, preferably—by dimensioning the pulse correspondingly—about an angle of 90° into the X,Y plane. Hereinafter a pulse which rotates the spin moments by the angle $\alpha$ will be described as an $\alpha$ pulse.

After the ending of the selective 90° pulse, according to the known process the direction of the selection gradient is reversed so as to effect rephasing of those spin moments within the section which were dephased during the period of the 90° pulse under the influence of the selection gradient. A further possibility for rephasing comprises the use of a 180° pulse, in the presence of an unaltered selection gradient. In both cases the selection gradient is switched off at the time rephasing is completed. This time represents the end of the selection phase; it is marked in the diagram of FIG. 1 as $t_1$. The complete rephasing of the spin moments at the time $t_1$ is connected with the appearance of a core induction signal in the form of a so-called spin echo 1.

However, the selection phase is not the subject of the invention. Therefore, it is not fully shown on the diagram of FIG. 1. Hereafter, it will only be assumed that during the selection phase the spin moments within the section to be imaged have been rotated as completely as possible into the X,Y plane, in the manner described above or in another way, so that they rotate in phase around the Z-direction at the time $t_1$.

The phase position of the spin moments within the X,Y plane is described in accordance with the general practice by means of a coordinate system rotating with the Larmor frequency of $B_0$ around the direction of the Z-axis. The directions in this system will be designated below as X,Y, and Z, of which the Z direction is fixed, while the X and Y directions rotate in the X,Y plane. (In a static coordinate system the directions X and Y represent the phase positions of a precession movement taking place at Larmor frequency around the direction of the Z-axis). Hereinafter the X-direction is defined by the assumption that the selective excitation has taken place due to a 90°, X-pulse. This is understood to mean a pulse which rotates the spin moments around the direction X by 90° so that at the time $t_1$ they point in the Y-direction of the rotating coordinate system. This phase position of the spin moments at time $t_1$ is shown in FIG. 2a at 9.

At the time $t_1$ the phase coding gradient $G_P$ is switched on, having a dephasing effect such that at its end at the time $t_2$, the phase position of certain spin moments has been rotated into the direction indicated by the arrow 2 (FIG. 2b). The 2DFT process is based on the fact that by variation of the duration or of the intensity of the phase coding gradient $G_P$ differing phase positions are adjusted which produce different intensities of the signals measured by the read gradient $G_L$, which after appropriate processing of said signals, makes possible the imaged representation of a cross-sectional plane of the sample.

As is shown in FIG. 2b, the spin moment 2 can be broken down into a Y component 3 and an X component 4. With respect to these components, dephasing of the spin moments takes place until time $t_3$ of the first 180° pulse which dephasing is caused by the variation of the magnetic field due to the read gradient switched on at time $t_2$ and also to the nonhomogeneities of the field. The dephasing for the Y and the X components at time $t_3$ is shown in FIGS. 2c and 2d. The 180° pulse at time $t_3$ is used in the conventional manner to reverse the dephasing so that at a certain time after the 180° pulse 5, an echo signal 6 is generated. In the case of the embodiment shown the pulse 5 is assumed to be a 180° Y-pulse which produces a rotation of the spin moments by 180° around the Y-axis.

To illustrate this rotation, the spin moments of FIGS. 2c and 2d are depicted in FIGS. 3a and 3b in their projection in the X,Z plane. The 180° pulse rotating around the Y-axis has the same effect on the Y component 3 of FIG. 2b as the pulse of a Carr-Purcell-Gill-Meiboom sequence. It is characteristic of this pulse sequence that not only are the phase errors compensated which are caused by differing Larmor frequencies as a result of magnetic field non-homogeneities, but that in the course of the pulse sequence those errors are also compensated which arise because due to the defective adjustment of the pulse length or to a local variation of the $H_1$ field strength, certain spin moments are in fact rotated by a 180° pulse by a smaller or a larger angle than 180°. How this compensation is effected is shown in FIG. 3a. The too small rotation from 11 to 12 by the pulse 5 is compensated by the displacement of the starting point in 13, so that after the next 180° pulse 7 at the echo signal 8 (FIG. 1), the spin moment is again located in the X,Y plane (position 14). The behavior is different in the case of the X component 4 of FIG. 2b of the spin moment according to FIG. 3b. Here the rotation from position 21 to position 22 is followed by the equally too small rotation from pos. 23 to pos. 24, whereby the phase error is increased. The consequence of that is that when using a Carr-Purcell-Gill-Meiboom pulse sequence according to FIG. 1, the signal share arising from the X component completely disappears in a short time and only the signal share from the Y component remains. If a pulse sequence rotating around the X-axis were to be used, compensation with respect to the signal share emanating from the X component would occur, whereas the signal share emanating from the Y component would disappear.

Figure 4B:
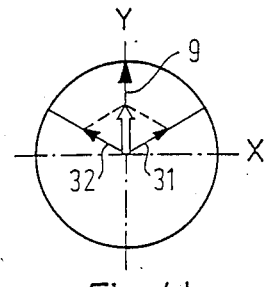

In the embodiment shown in FIG. 1 which corresponds to the prior art and which shows a spin echo pulse sequence (Carr-Purcell-Gill-Meiboom pulse sequence) it is therefore assumed that because of the ever present deviations from 180° of the angle of rotation, the signal share arising out of the X component disappears in the course of some echos. This causes a loss of information, and the sole residual signal share which came from the Y component will be interpreted as if at the time $t_2$, instead of the spin moment 2 with the correctly coded phase position (FIG. 4a), two spin moments 31, 32, each having half the strength of 2, were present which had resulted due to the original phase position under the phase coding gradient and whose resultant force is the Y component 3 (FIG. 4b). The components 31, 32 of the spin moment produce the mirror images which totally distort the actual cross-sectional image and therefore previously made the use of spin echo pulse sequences impossible when employing the 2DFT technology. In the same way mirror images also appear with the other known spin echo pulse sequences, in which the phase position of the 180° pulse remains the same or simply alternates.

The conditions described above can be summed up by stating that the cause of the mirror images with the 2DFT process is to be found in the dephasing of the spin moments because of the one-time influence of the phase coding gradient between the times $t_1$ and $t_2$ in FIG. 1. Since the phase coding gradient in the known process is not switched on again between the 180° pulses in contrast to the dephasing effected under the influence of the read gradient, no rephasing takes place in the course of the spin echo sequence, with respect to this dephasing, which means that the rephasing condition is fulfilled solely for the read gradient, but not for the phase coding gradient. The initial phase position, against which the rephasing takes place in the course of the spin echo pulse sequence shown in FIG. 1, is therefore the phase position of the spin moments at the time $t_2$. Since this phase position as a rule is not identical with the Y-direction (cf. FIG. 2), no complete compensation of the 180° error is possible for the reasons stated above when using the known spin echo pulse sequences.

These relationships were not known and are by no means self-evident. On the contrary it required very intensive tests to arrive at an explanation of the mirror images. Because of the above interpretation of the origin of the mirror images, a process can now be described showing how to avoid these mirror images.

This process consists simply of the fact that between each pair of 180° pulses of the spin echo pulse sequence, the phase coding gradient is again switched on for a certain time, in such a way that the dephasing caused by the influence of the phase coding gradient between each pair of 180° pulses is twice as great as the dephasing caused by the influence of the phase coding gradient before the first 180° pulse. This can be done for example by doubling the duration of influence, with the same strength of the phase coding gradient, or by using the same duration of influence and doubling the gradient strength. In any case, the phase coding gradient should be switched so that the dephasing effected by this gradient is constant during the period of each measuring process and is the same for all the measuring processes within one spin echo pulse sequence.

Figure 5A:
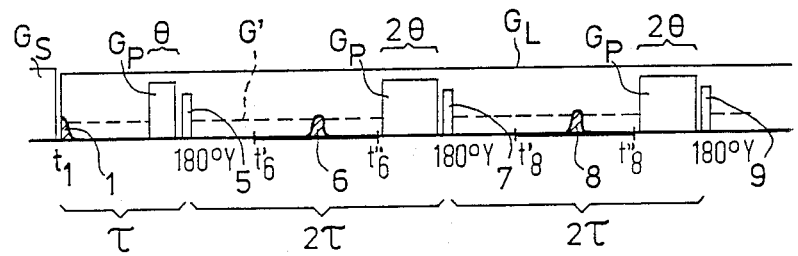
FIG. 5 shows a time diagram to explain of the first embodiment of the process according to the invention.
Figure 5B:
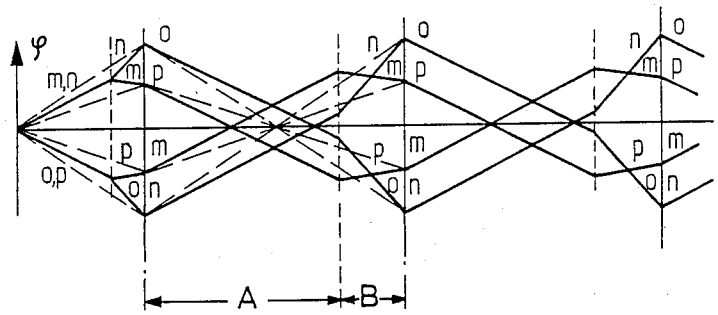
Figure 5C:
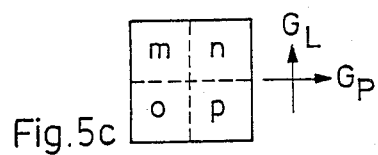

A possible embodiment of the process according to the invention is shown in FIG. 5. Initially, the phase coding gradient $G_P$ is switched on for a period $\theta$, between the end of the selection phase, marked as time $t_1$, and the first 180° pulse, with the read gradient $G_L$ present, and the strength of $G_P$ or the period $\theta$ are varied in the course of the necessary plurality of excitations of the spin moments which is required for the taking of the image when using the 2DFT process. (Since the dephasings under the influence of several gradients are independent of each other, it is advantageous in terms of saving time to apply the phase coding gradient and the read gradient jointly as shown in FIG. 5). The first 180° pulse 5 then takes place at a time T after the time $t_1$. After a further time T following the pulse 5, the echo 6 appears, whose signal course is measured between $t_6'$ and $t_6''$ with the read gradient applied. Between the end point in time $t_6''$ of the data gathering and the next 180° pulse 7, which follows the 180° pulse 5 at a time interval 2T the phase coding gradient is switched on in addition to the read gradient for the period 2 θ. The cycle described between the pulses 5 and 7 is then repeated corresponding to the number of echos desired for taking the picture. The phase position of the HF pulse now corresponds to a conventional Carr-Purcell-Gill-Meiboom sequence, i.e. the 180° pulses concerned are Y-pulses when excited through a 90°, X-pulse.

The effect of the gradient fields on the timed course of the phases is shown in FIG. 5b. This denotes four volume elements m, n, o, p which form the quarters of a square in the plane, of which the elements m, n as well as o, p are adjacent along the direction of the phase coding gradient, while the elements n, o or n, p are adjacent along the direction of the read gradient. After the time $t_1$ the volume elements m, n, because of the effect of the read gradient $G_L$, see a different magnetic field than the volume elements o, p. Accordingly the spins of the first two volume elements have a Larmor frequency different from that of the spins of the last-mentioned two volume elements. Therefore phase differences arise between the phase-identical spin moments at time $t_1$, which differences increase with time. While the phase of the spin moments of the volume elements m, n precede the zero phase in the example shown in the drawing, the phase of the spin moments of the volume elements o, p remains behind the zero phase. When applying the phase coding gradient $G_P$ a divergence of the phases additionally takes place between the volume elements m and n and/or between o and p. Due to the first 180° pulse 5, a phase reversal takes place (reflection on the phase position Y), whereupon during the period A a phase development again takes place only under the read gradient $G_L$, and subsequently during the period B a phase development takes place for the duration 2 θ under both the gradients. It is discernible that in this way, at the time of the 180° pulse 7, the phase conditions prevailing are again precisely the same as at the beginning of the time period A on appearance of the first 180° pulse. The further development is always the same.

The total dephasing effect at the times of the 180° pulse is exactly the same as if the phase coding gradient $G_P$ were switched on in the form of a constant resultant gradient G'. (The time path of the dephasing in this hypothetical case, which is mentioned only for the purpose of illustration, is shown by the interrupted line in FIG. 5b.) The process described therefore produces the same conditions as in a conventional Carr-Purcell-Gill-Meiboom sequence, by maintaining the rephasing condition for the phase coding gradient as well. Therefore the compensating effect of the conventional CPGM sequence is also fully available.

A second embodiment of the process according to the invention is shown in FIG. 6. In this case the phase coding gradient is again switched on for the period 2 θ between the end of each 180° pulse 5, 7 etc. and the beginning of the times $t'_6$, $t'_8$ etc. of the subsequent measuring process. From the lateral phase curve shown in FIG. 6b it is at once apparent that in this case as well, the rephasing condition is fulfilled for both gradients.

Figure 6A:
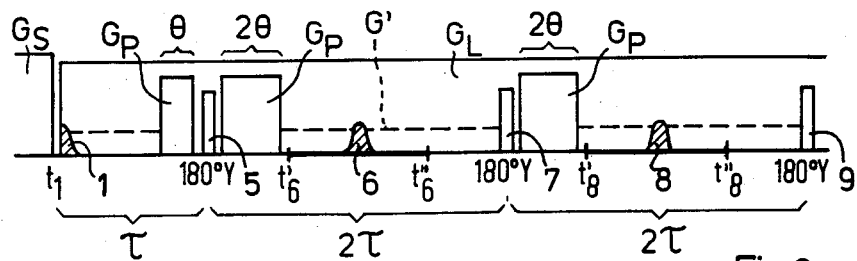
FIG. 6 shows a time diagram to explain a second embodiment of the process according to the invention.
Figure 6B:
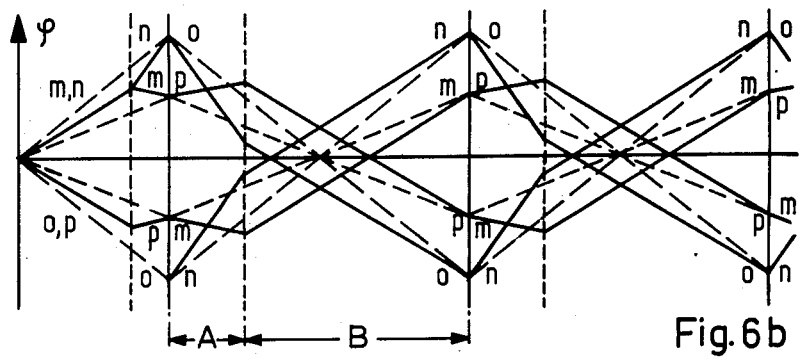
Figure 6C:
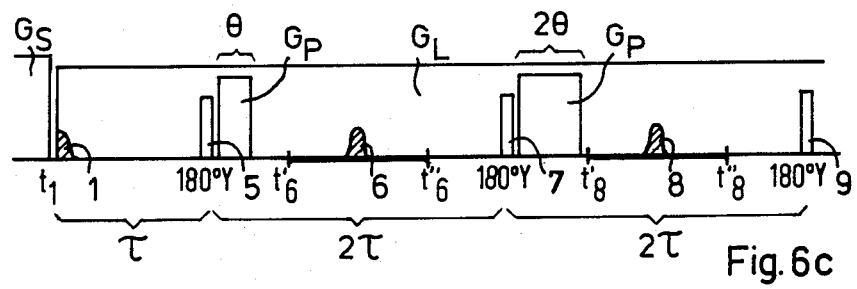
Figure 6D:
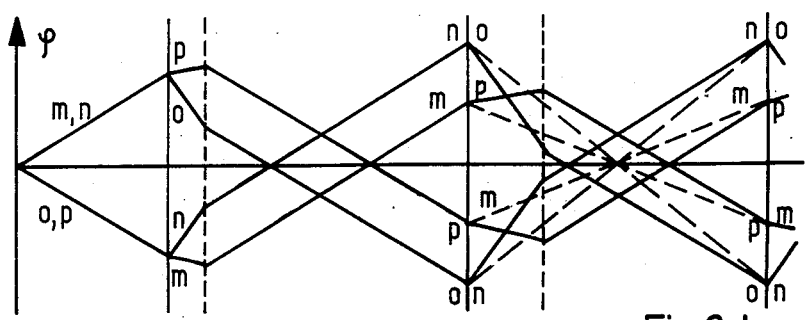

In a modification of the embodiment shown in FIGS. 6a and 6b, it is also possible to dispense with the first switching-on of the phase coding gradient before the first 180° pulse 5, and instead to switch on the phase coding gradient between the 180° pulse 5 and the beginning $t'_6$ of the first measuring process solely for the single duration θ. This modification, in which the rephasing condition for the phase coding gradient is only fulfilled as from the second 180° pulse 7, is illustrated in FIGS. 6c and 6d. From FIG. 6d it can be seen that the dephasings during the first and subsequent measuring processes are the same as seen in the embodiment shown in FIGS. 6a and 6b.

Figure 7A:
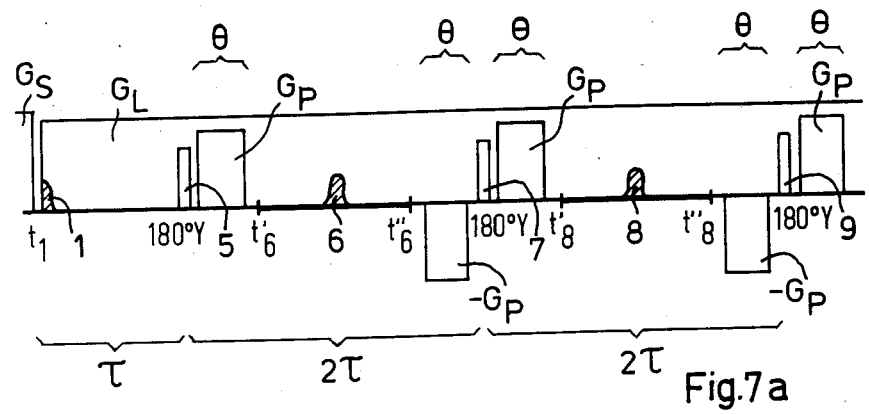
FIG. 7 shows a time diagram to explain a third embodiment of the process according to the invention.
Figure 7B:
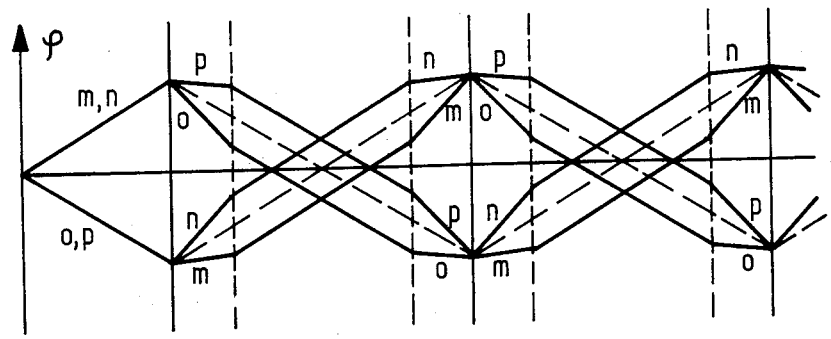

A third embodiment of the process is illustrated in FIG. 7. In this embodiment, the phase coding gradient remains switched off before the beginning of the first 180° pulse. Consequently during this period of time, no dephasing is effected by the phase coding gradient. To maintain the rephasing condition, therefore, the dephasing caused by the phase coding gradient between each pair of adjacent 180° pulses must also be cancelled out. This is achieved in the embodiment shown in that the phase coding gradient is switched on respectively before the beginning $t'_6$, $t'_8$ etc. of the measuring process for a period θ, and is again switched on after the end $t''_6$, $t_{41\ 8}$ etc. of the measuring process for the same period θ, but with a reversed sign.

The last-mentioned and third embodiment of the process according to the invention has the advantage that the time interval between two 180° pulses has to be extended by the maintenance of the rephasing condition for the phase coding gradient only by the time 1 θ, as against 4 θ in the case of the two other embodiments, which means a particularly favorable exploitation of the total measuring time.

A further advantage of all the embodiments of the process according to the invention consists of the fact that images obtained from two consecutive echos, by contrast with the known process for the generation of spin echoes using the 2DFT process, are not mirror-imaged, so that the reversal of the images is not necessary.

The process according to the invention was tested using a phantom, and it supplied excellent and practically reflection-free images.

We claim:

1. In a process for the excitation of a samples for NMR tomography, in which the sample is exposed to a homogenous magnetic field and in addition to a selection gradient and is excited by means of a 90° selection pulse, whereafter the selection gradient is replaced by a phase coding gradient of limited time duration and a read gradient, the selection gradient, the phase coding gradient and the read gradient being mutually perpendicular to each other, and wherein finally the sample, after the ending of the phase coding gradient and with prevailing read gradient, is irradiated with a sequence of 180° pulses, whereby a plurality of core induction signals is generated in the form of so-called spin echos, the improvement comprising the step of subjecting the sample to the influence of the phase coding gradient in such a manner that the dephasing caused by the influences of the phase coding gradient and of the read gradient between each pair of 180° pulses is twice as great as the dephasing effected by the influences of these two gradients before the first 180° pulse.

2. Process according to claim 1, wherein said step of subjecting includes subjecting the sample to the influence of teh phase coding gradient during the period between the end of each signal gneration and the beginning of the subsequent 180° pulse.

3. Process according to claim 1, wherein said step of subjecting includes subjecting the sample to the influence of the phase coding gradient during the period between the end of each 180° pulse and the beginning of the subsequent signal generation.

4. Process according to claim 2 or claim 3, wherein between each pair of 180° pulses the phase coding gradient to which the sample is subjected is effective with the same strength, but for twice the duration as before the beginning of the first 180° pulse.

5. Process according to claim 2 or claim 3, wherein said step of subjecting includes subjecting the sample to the influence of the phase coding gradient in such a manner that between each pair of 180° pulses the phase coding gradient is effective for the same duration but with twice the strength as before the begininning of the first 180° pulse.

6. In a process for the excitation of a sample for NMR tomography in which the sample is exposed to a homogenous magnetic field and in addition to a selection gradient and is excited by means of a 90° selection pulse, whereafter the selection gradient is replaced by a phase coding gradient of limited time duration and a read gradient, the selection gradient, the phase coding gradient and the read gradient being mutually perpendicular to each other, and wherein finally the sample, with prevailing read gradient, is irradiated with a sequence of 180° pulses, as a result of which a plurality of core induction signals is generated in the form of so-called spin echos, the improvement comprising the steps of switching on the phase coding gradient for the first time after the first 180° pulse and thereafter periodically applying the phase coding gradient in such a manner that it is switched on once between each pair of 180° pulses for a certain period before said core induction signals are generated, and then again for another period after the end of the generation of said signals but before the beginning of the subsequent 180° pulse, so that the dephasings caused during the two switch on periods cancel out each other.

7. Process according to claim 6, wherein before and after the signal generation the phase coding gradient is effective with identical duration and strength, but with different signs.

* * * * *